United States Patent
Lin et al.

(10) Patent No.: US 8,293,649 B2
(45) Date of Patent: Oct. 23, 2012

(54) RELEASE ACCUMULATIVE CHARGES ON WAFERS USING $O_2$ NEUTRALIZATION

(75) Inventors: Ting-Yi Lin, Hsin-Chu (TW); Chi-Yuan Wen, Tainan (TW)

(73) Assignee: Global Unichip Corp., Hsin-Chu (TW)

( * ) Notice: Subject to any disclaimer, the term of this patent is extended or adjusted under 35 U.S.C. 154(b) by 350 days.

(21) Appl. No.: 12/642,747

(22) Filed: Dec. 18, 2009

(65) Prior Publication Data
US 2011/0147338 A1 Jun. 23, 2011

(51) Int. Cl.
*H01L 21/302* (2006.01)
*H01L 21/461* (2006.01)

(52) U.S. Cl. ........ 438/689; 438/706; 438/707; 438/710; 438/714; 438/725; 216/13

(58) Field of Classification Search .......... None
See application file for complete search history.

(56) References Cited

U.S. PATENT DOCUMENTS

| | | |
|---|---|---|
| 5,916,689 A | 6/1999 | Collins et al. |
| 6,168,726 B1 * | 1/2001 | Li et al. ............... 216/79 |
| 6,686,254 B2 | 2/2004 | Petrucci et al. |
| 6,862,723 B1 | 3/2005 | Wang et al. |
| 6,872,322 B1 * | 3/2005 | Chow et al. ........... 216/67 |
| 2005/0032253 A1 * | 2/2005 | Hsu et al. ............. 438/17 |

* cited by examiner

*Primary Examiner* — Duy Deo
(74) *Attorney, Agent, or Firm* — Slater & Matsil, L.L.P.

(57) ABSTRACT

A method of forming an integrated circuit structure on a wafer includes providing an etcher having an electrostatic chuck (ESC); and placing the wafer on the ESC. The wafer includes a conductive feature and a dielectric layer over the conductive feature. The method further includes forming and patterning a photo resist over the wafer; and etching the dielectric layer to form a via opening in the wafer using the etcher. An ashing is performed to the photo resist to remove the photo resist. An oxygen neutralization is performed to the wafer. A de-chuck step is performed to release the wafer from the ESC.

21 Claims, 5 Drawing Sheets

RELEASE ACCUMULATIVE CHARGES ON WAFERS USING O₂ NEUTRALIZATION

TECHNICAL FIELD

This invention relates generally to integrated circuit manufacturing processes and more particularly to via-etching processes.

BACKGROUND

Integrated circuits typically include a plurality of layers comprising different materials. These layers are formed or deposited using a variety of different processes. These deposited layers are patterned to form final designs and the patterning of the deposited layer includes etching processes.

Since the formation of integrated circuits involves many, sometimes hundreds of process steps, controlling the failure rate in each of the process steps becomes vitally important. When a failure occurs, the failed components need to be identified. Further research is then performed to find the reasons of the failure and to determine how process steps can be adjusted to avoid the failure.

The failures, however, are sometimes subtle and may only occur to some of the integrated circuits (products), but not to other circuits. The process steps therefore need to be customized to solve these product-specific problems. For example, in some of the input/output (IO) chips, it was found that the joint test action group (JTAG) failure rate is particularly high, sometimes as high as about 12 percent to about 18 percent. Solutions to these types of problems are therefore needed.

SUMMARY OF THE INVENTION

In accordance with one aspect of the present invention, a method of forming an integrated circuit structure on a wafer includes providing an etcher having an electrostatic chuck (ESC); and placing the wafer on the ESC. The wafer includes a conductive feature and a dielectric layer over the conductive feature. The method further includes forming and patterning a photo resist over the wafer; and etching the dielectric layer to form a via opening in the wafer using the etcher. An ashing is performed to the photo resist to remove the photo resist. An oxygen neutralization is performed to the wafer. A de-chuck step is performed to release the wafer from the ESC.

In accordance with another aspect of the present invention, a method of forming an integrated circuit structure on a wafer includes providing a first etcher having a first ESC; forming and patterning a first photo resist on the wafer; placing the wafer on the first ESC; forming a via opening in the wafer using the first etcher, ashing the first photo resist after the step of forming the via opening; performing an oxygen neutralization step to the wafer; and performing a first de-chuck to the wafer. The method further includes forming and patterning a second photo resist on the wafer; placing the wafer on a second ESC of a second etcher; performing an etching step to form an additional opening in the wafer using the second etcher; and performing a second de-chuck to the wafer. No oxygen neutralization step is performed to the wafer in the second etcher.

In accordance with yet another aspect of the present invention, a method of forming an integrated circuit structure includes providing an etcher having an ESC; forming and patterning a first photo resist on a first wafer; placing the first wafer on the ESC; forming a first via opening in the first wafer using the etcher; ashing the first photo resist after the step of forming the first via opening; performing an oxygen neutralization step to the first wafer; and performing a first de-chuck to the first wafer. The method further includes forming and patterning a second photo resist on a second wafer; placing the second wafer on the ESC; forming a second via opening in the second wafer using the etcher; ashing the second photo resist after the step of forming the second via opening; and performing a second de-chuck to the second wafer. No oxygen neutralization step is performed to the second wafer in the etcher.

Advantageously, by using the embodiments of the present invention, the joint test action group (JTAG) failures occurring to some wafers are solved using customized etching processes. In addition, the solutions provided by the embodiments of the present invention do not involve the redesign of integrated circuits.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments of the present invention provide many applicable inventive concepts that can be embodied in a wide variety of specific contexts. The specific embodiments discussed are merely illustrative of specific ways to make and use the invention and do not limit the scope of the invention.

Figure 1:
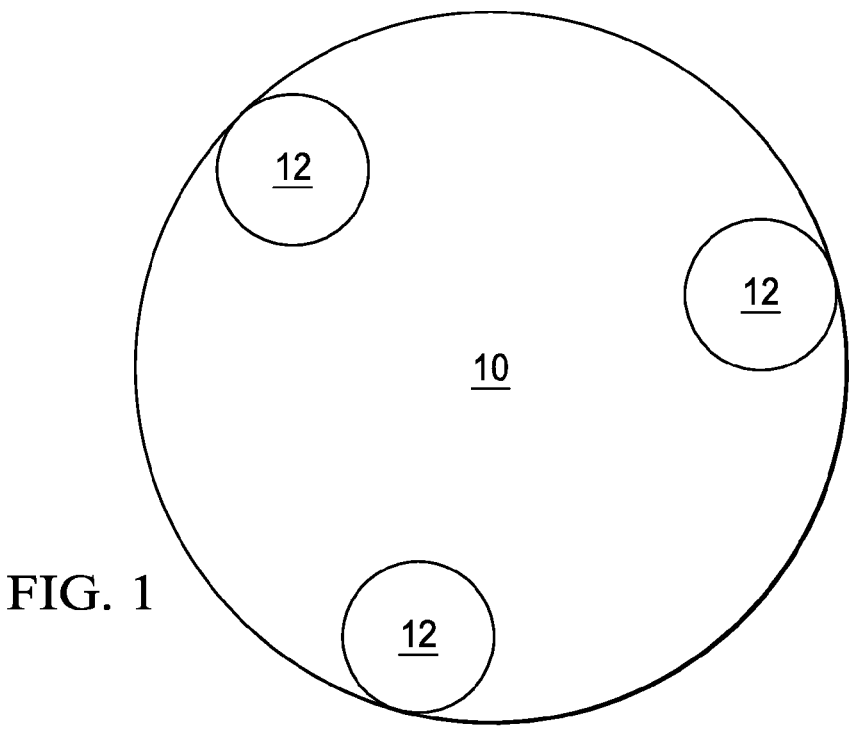
FIG. 1 illustrates a schematic view of a wafer showing the locations of joint test action group (JTAG) failures.

In the manufacturing of an input/output related integrated circuit, it was found that the joint test action group (JTAG) test failure rate of the chips in some wafers is unexpectedly high. By pin-pointing the chips having the failures, it was found that the failed chips are mainly at the corners and the center of wafers, particularly at the corners. FIG. 1 schematically illustrates three corners 12 in wafer 10 that are prone to the JTAG failures. Further study for the cause of the failure has revealed that corners 12 were directly over the lift pins of the etchers when via-etching processes were performed to the wafers.

Figure 2:
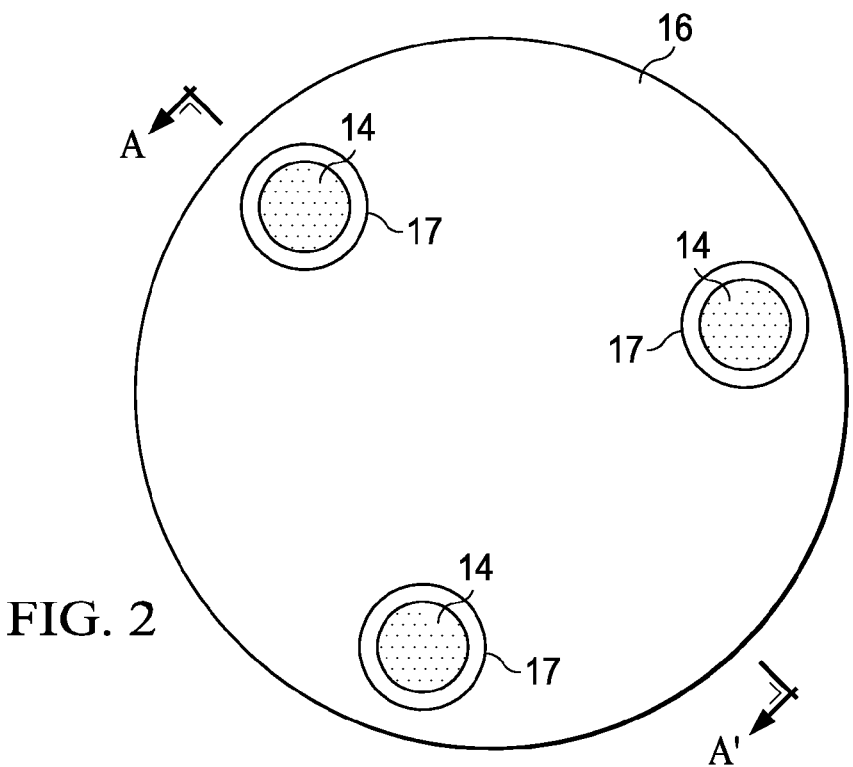
FIG. 2 illustrates a top view of an electrostatic chuck (ESC) and lift pins in an etcher.

FIG. 2 illustrates a top view of electrostatic chuck 16 (ESC, also referred to as E-Chuck) and lift pins 14. Wafer 10 (FIG. 1) may be placed over ESC 16 in the etching process. Three lift pins 14 are inside holes 17 in ESC 16, wherein lift pins 14 are used to lift up wafer 10 after the via-etching process is finished. Experiments performed by the inventors of the present invention have revealed that the corners 12 prone to the JTAG failures are directly overlying lift pins 14. The JTAG failures occur to the gate dielectrics and the overlying polysilicon gate electrodes (not shown) of the chips directly over lift pins 14. On the transmission electron microscopy (TEM) images, it was found that polysilicon gates are damaged in the failed chips. However, in other chips not directly over lift pins 14, the JTAG failure rate is significantly lower. One possible explanation of such a phenomenon is that during the plasma etching for forming via openings, antenna effect occurs, and charges are accumulated to the conductive paths including the metal exposed through the via opening, the polysilicon gate, and the metals therebetween. When lift pins 14 lift wafer 10 up, since lift pins 14 are grounded, the accumulated charges are discharged to a ground. Since the chips directly overlying the lift pins have small discharging resistances to the ground, the discharging currents are relatively high, and hence the polysilicon and/or the underlying gate dielectrics are damaged, resulting in the JTAG failure. On the other hand, the chips not directly over lift pins 14, at the time lift pins 14 contact wafer 10, have relatively high discharging resistances, and hence the discharging currents are relatively low, resulting in a smaller JTAG failure rate.

Figure 3:
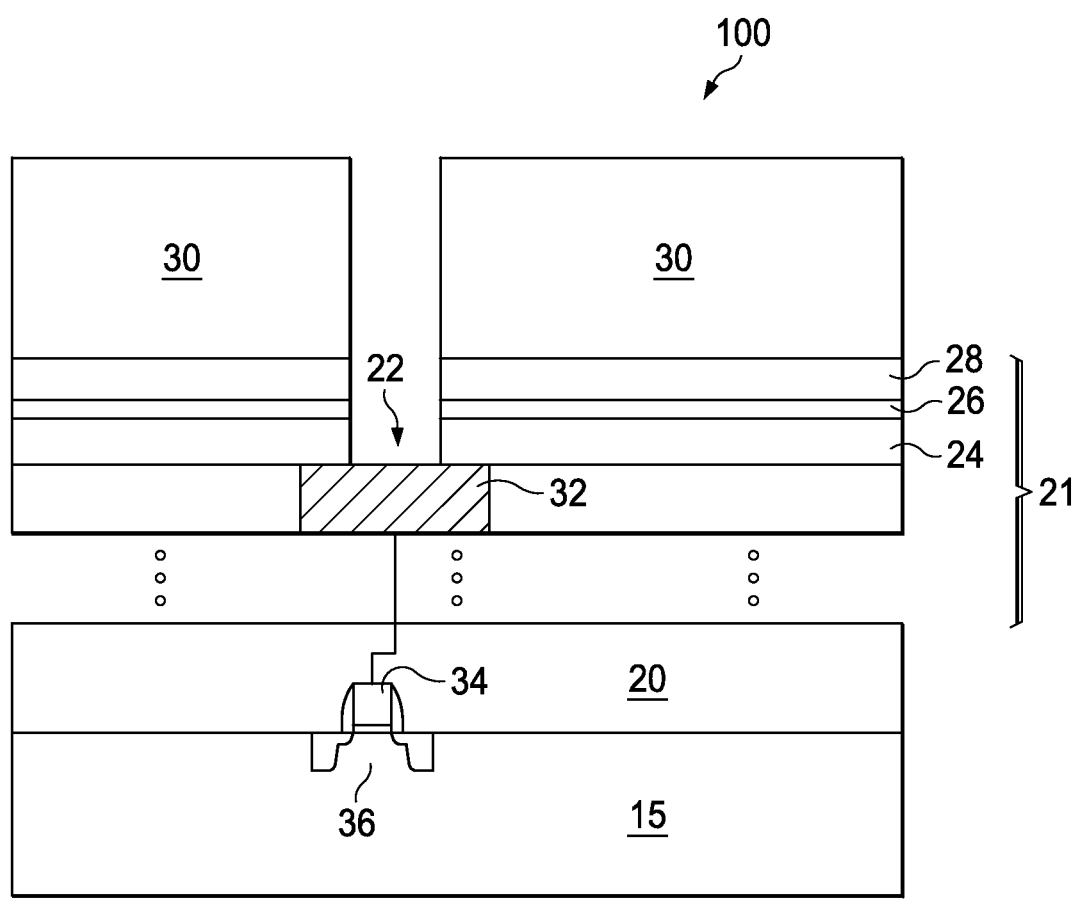
FIG. 3 illustrates a cross-sectional view of a wafer on which a via-etching process is performed.

Based on the above-findings, a novel via-etching process is presented. Throughout the various views and illustrative embodiments of the present invention, like reference numbers are used to designate like elements. Throughout the description, an exemplary structure as shown in FIG. 3 is used to explain the concept of the embodiments of the present invention. One skilled in the art will realize, however, that the teaching provided by the embodiments may be applied to the formation of other integrated circuit components.

FIG. 3 illustrates a cross-sectional view of wafer 100, which includes a plurality of chips. Over semiconductor substrate 15, inter-layer dielectric (ILD) 20 and dielectric layers 21 are formed. Dielectric layers 21 may include dielectric layer 24, etch stop layer 26, and dielectric layer 28. Dielectric layers 24 and 28 may be low-k dielectric layers comprising low-k dielectric materials, for example, with k values less than about 2.5. Throughout the description, dielectric layer 24 is referred to as a via inter-metal dielectric (IMD), while dielectric layer 28 is referred to as a trench IMD. In an embodiment, the via-etching of the embodiments of the present invention is for forming via opening 22, through which underlying conductive feature 32 is exposed. Conductive feature 32 is electrically coupled to gate electrode 34 of transistor 36 through metal lines and vias (not shown, symbolized using a line). Since conductive feature 32 is exposed as a result of the via-etching, antenna effect may occur, and the charges produced in the plasma etching may be accumulated to conductive feature 32 and gate electrode 34.

Figure 4:
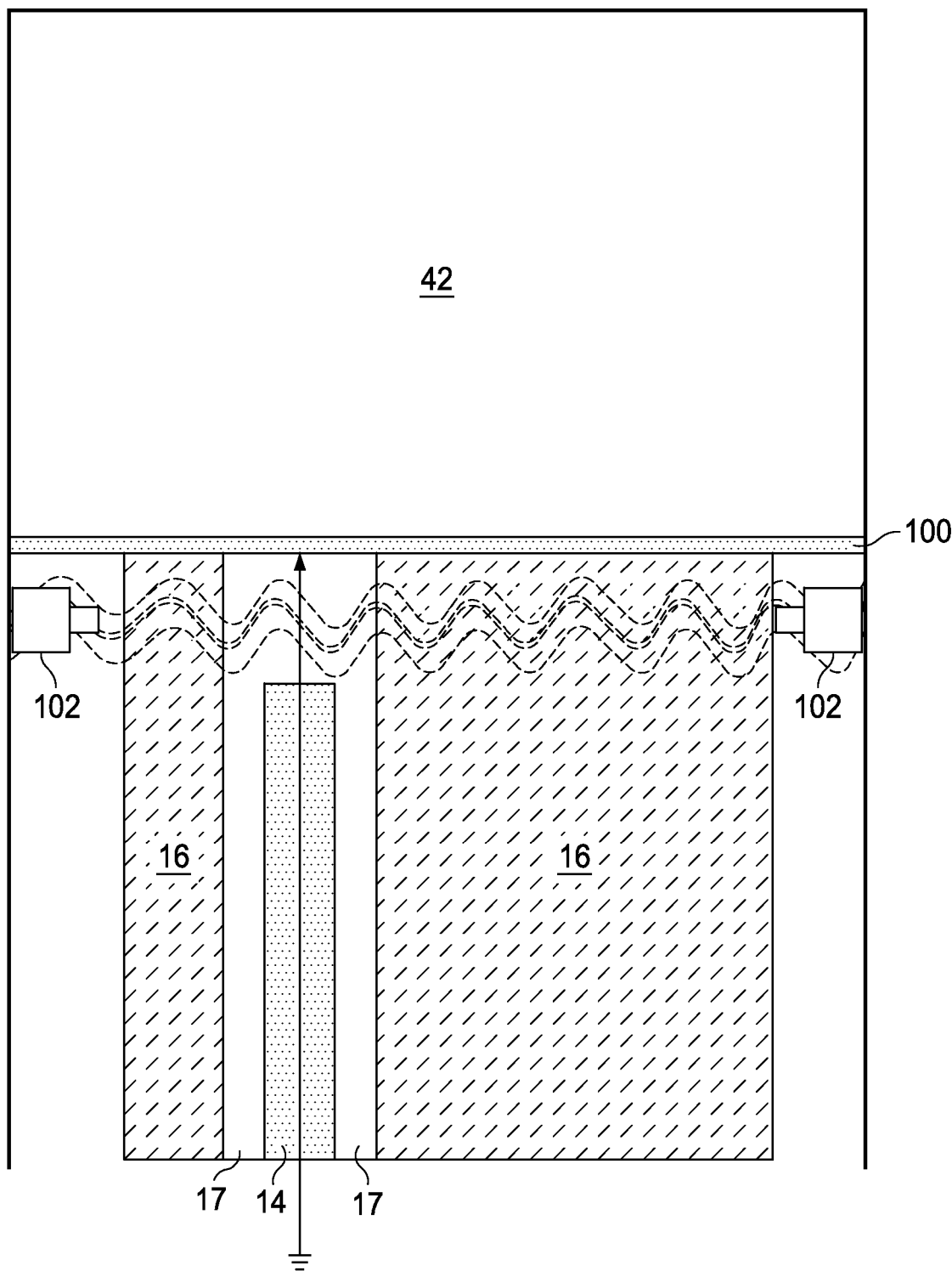
FIG. 4 illustrates a cross-sectional view of an etcher.

FIG. 4 illustrates etcher 40 for performing an embodiment of the present invention. Etcher 40 includes chamber 42 that can be vacuumed in the etching process. During the etching process, process gases are introduced into chamber 42. Plasma may be generated out of the process gases by applying energy to ionize the process gases. ESC 16 is located in chamber 42. Holes 17 are made penetrating ESC 16, in which lift pins 14 are located, with each of lift pins 14 in one of holes 17. FIG. 2 is a top view of ESC 16 and a lift pin 14, wherein the cross-sectional view of ESC 16, as shown in FIG. 4, is made in a plane crossing line A-A' in FIG. 2. Lift pins 14 may moved up and down in holes 17. ESC 16 may be applied with a positive voltage to hold wafer 100 thereon, or a negative voltage to release wafer 100, so that wafer 100 may be lifted up from ESC 16 by lift pins 14.

In an embodiment, wafer 100, as in FIG. 4, includes a structure as shown in FIG. 3. Referring to FIG. 3, before via opening 22 is formed, photo resist 30 is formed over trench IMD 28, and is developed, so that the pattern of via opening 22 is defined. Referring back to FIG. 4, wafer 100 is then placed into chamber 42. A positive voltage, for example, about 700V, is applied to ESC 16 so that a static force is generated to attract wafer 100 onto ESC 16. An etching process may then be performed to etch trench IMD 28, etch stop layer 26, and via IMD 24, until conductive feature 32 (FIG. 3), for example, a metal line or a metal pad, is exposed. The etching includes plasma (dry) etching, so that the process gases in chamber 42 are ionized. Accordingly, conductive feature 32 is in contact with the plasma. Next, photo resist 30 is ashed, for example, using an oxygen-containing process gas. During the via-etching step and the subsequent ashing of photo resist 30, helium is introduced to the backside of wafer 100 for a heat-dissipating purpose.

The ashing process results in the removal of photo resist 30. A de-chuck process is then started to release (neutralize) the charges in wafer 100 so that the holding force that holds wafer 100 on ESC 16 is at least reduced, or even substantially eliminated. An $O_2$ neutralization step, which is part of the de-chuck process since it has the function of releasing charges in wafer 100, is performed. In an embodiment, the $O_2$ neutralization step includes introducing oxygen-containing gases, such as $O_2$ or the combined gas including $O_2$ and other gases, such as carbon monoxide (for example with a ratio of partial pressure of O2 to the partial pressure of carbon monoxide being about 15:1) into chamber 42. A power, for example, a radio frequency (RF) power (for example, about 300 watts), is used to generate oxygen plasma. In an embodiment, the process conditions of the $O_2$ neutralization step include an $O_2$ pressure of about $10^{-3}$ torrs. The $O_2$ neutralization step may last between about 3 seconds and about 15 seconds, preferably between about 3 seconds and about 6 seconds. In an exemplary embodiment, the $O_2$ neutralization step lasts about 6 seconds, although a longer or a shorter period of time may also be used. During the $O_2$ neutralization step, helium flow may be turned off. In alternative embodiments, the $O_2$ neutralization step may be performed using substantially the same process conditions (such as the length of the process time, energy, temperature, process flow rate, and/or the like) as the photo resist ashing step, including or not including continuing to provide the helium flow.

As an additional part of the de-chuck process, an argon de-chuck is performed, wherein argon is introduced into chamber 42, and a RF power, for example, about 400 watts, is applied to ionize argon and generate argon plasma. The RF energy may be applied for about 10 seconds. It is expected that by applying the argon plasma, the accumulated charges built up in wafer 100 are at least partially neutralized. The argon de-chuck is part of the de-chuck process because it also has the effect of releasing wafer 100. Starting from the time the argon gas is introduced and ionized, helium may also be restored to flow into etcher 40, if it has been disrupted in the $O_2$ neutralization step.

During or after the period when the argon plasma is in chamber 42, a reverse de-chuck voltage is applied to ESC 16 to de-chuck (release) wafer 100. In an exemplary embodiment, the reverse de-chuck voltage is about −1300V. The reverse de-chuck voltage may be applied, for example, about 2 seconds, although a longer or shorter period of time may also be used.

Figure 6:
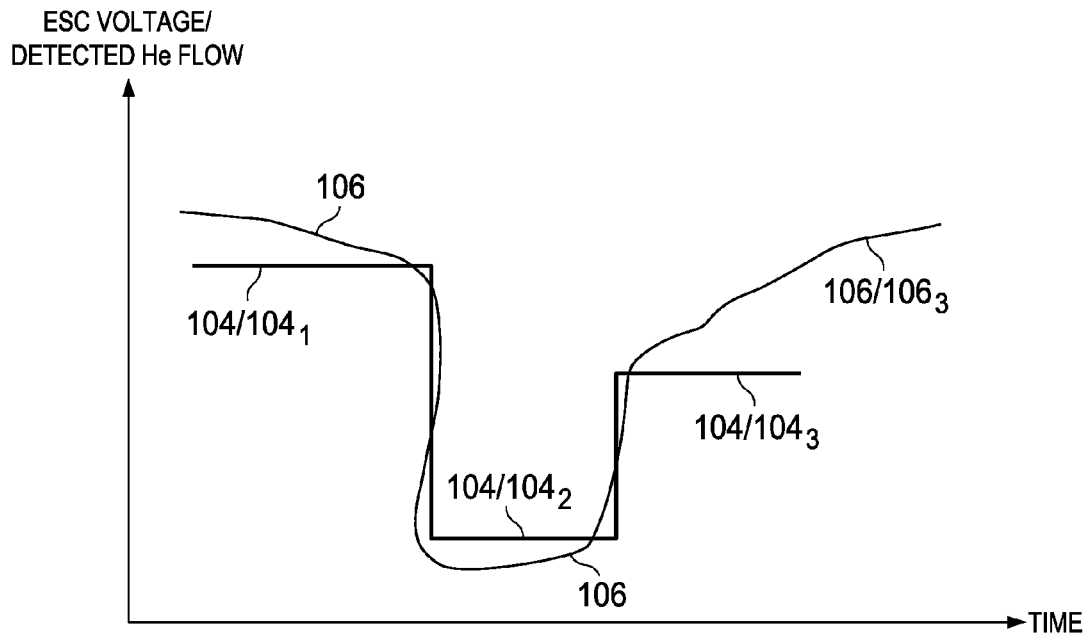
FIGS. 6 and 7 illustrate the correlation between the detected helium flow at the backsides of wafers and the voltages applied to ESCs.

Referring to etcher 40 as shown in FIG. 4, detective sensor 102 is provided and may be installed close to the backside of wafer 100. Detective sensor 102 has the ability of detecting the flow of helium, for example, by detecting the pressure of the helium. Experiments have revealed that although a substantially constant helium flow may be provided, the detected helium flow may not be a constant and has a correlation with the voltage applied on ESC 16. For example, FIG. 6 illustrates the detected helium flow and the voltages on ESC 16 as functions of time. Line 104 represents the voltage applied to ESC 16. Portion $104_1$ represents the positive voltage (for example, about 700V) that is used to hold wafer 100 on ESC 16. Portion $104_2$ represents the reverse de-chuck voltage, for example, about −1300V. Portion $104_3$ represents a voltage of 0V, which may be applied to ESC 16 when wafer 100 is lifted from ESC 16, and/or when the vacuum of etcher 40 is broken. Line 106 represents the corresponding detected helium flow when the above-discussed voltages are applied. It was found that lines 104 and 106 have similar behaviors, for example, both having high values and low values that transition at the same time and move in same directions. It is noted that lines 104 and 106 are illustrated using relative scales.

FIG. 6 illustrates a normal case of the correlation between the detected helium flow and the voltages on ESC 16. It was found that if the detected helium flow has the pattern as shown in FIG. 6, in which portion $106_3$ has no sudden drop, the corresponding wafers will have very low JTAG failure rates. The measurements performed on the respective wafers have revealed that the voltage potentials on the respective wafers, which voltage potentials reflect the charge accumulation status, range between about −0.76V and about −0.1V, with the difference of only about 0.85V. This means that there is no excess charge accumulation in the wafers.

Figure 7:
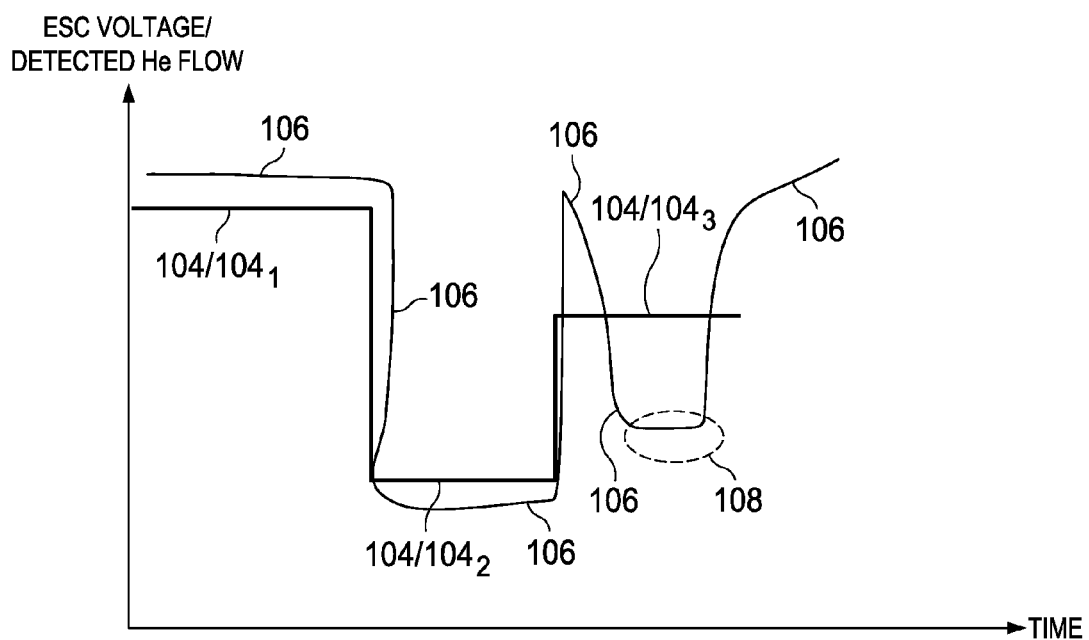

As a comparison, FIG. 7 illustrates an abnormal case of the correlation between the detected helium flow and the voltages on ESC 16. It was found that the detected helium flow may show an unexpected drop 108. If the detected helium flow has the pattern as shown in FIG. 7, the resulting wafers will have high JTAG failure rates. The measurements performed on the respective wafers have revealed that the voltage potentials on the respective wafers range between about −0.55V and about −6.1V, with the difference being about 5.53V. Such a big voltage potential difference indicates a high amount of charges built up on the wafers and are not sufficiently released by the $O_2$ neutralization step and other de-chuck steps. As a result, corners 12 (refer to FIG. 1) again have high JTAG failures.

The results shown in FIGS. 6 and 7 may be used to determine the charge release status of wafers and to predict whether high JTAG failures will occur on wafers, without the need to wait for the wafers to be tested. By monitoring the helium flow, the etching processes may be improved, particularly for finding the optimum etching recipe. On the other hand, the detected helium flow may be used to determine whether additional charge neutralization steps are needed. In an embodiment, if abnormal helium flow is detected, an additional $O_2$ neutralization step and/or argon de-chuck step may be added. Alternatively, the existing $O_2$ plasma neutralization step may be further prolonged.

In alternative embodiments, the order of the $O_2$ neutralization step and the argon de-chuck step may be reversed. For example, after the photo resist ashing step, the argon de-chuck is preformed. Next, the $O_2$ neutralization step is performed, wherein the details of the argon de-chuck and the $O_2$ neutralization step may be essentially the same as discussed in the preceding paragraphs.

After the de-chuck process, lift pins 14 are raised to lift up wafer 100. Lift pins 14 are grounded and contact the backside of wafer 100. Accordingly, charges that are accumulated in the exposed conductive features may be discharged through the backside of wafer 100.

Figure 5:
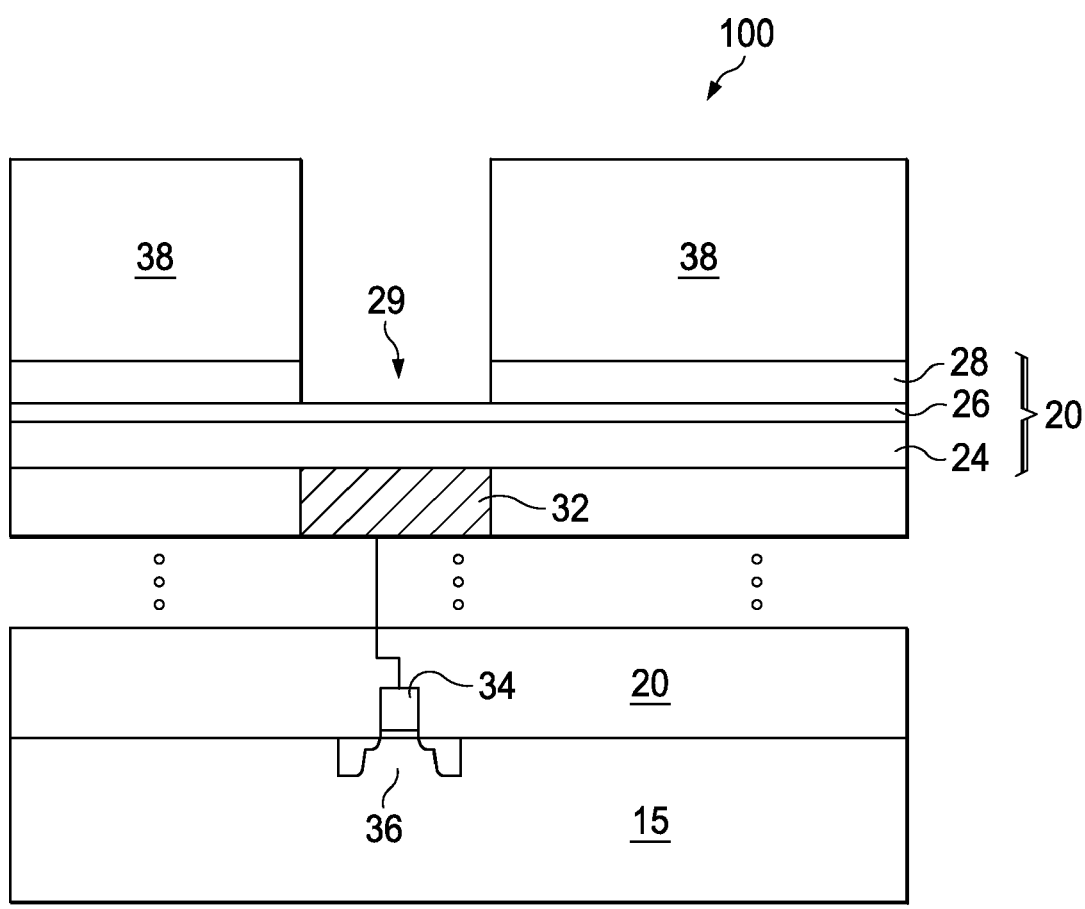
FIG. 5 illustrates a cross-sectional view of a wafer on which a trench-etching process is performed.

Referring back to FIG. 5, the formation of integrated circuits also includes the formation of trench openings, in which metals are filled to form metal lines and metal pads. As is known in the art, trench opening 29 may be formed before the formation of via opening 22 (which is referred to as a via-last approach), or after the formation of via opening 22 (which is referred to as a via-first approach). Wafer 100 thus needs to go through a similar process, as the above-discussed via-etching process, to form trench opening 29. In an embodiment of the present invention, trench opening 29 of wafer 100 is formed using a same etcher as, or a different etcher from, the etcher used for forming via opening 22. The process for the trench etching is known in the art, and hence is not described in detail herein. After the etching of trench IMD 28 and the ashing of photo resist 38, wafer 100 is released from ESC 16. The de-chuck process of the trench-etching is similar to the de-chuck process for the via-etching, except the $O_2$ neutralization step may not added. In alternative embodiments, in the trench etching, the $O_2$ neutralization step may also be added.

On the other hand, via-etching is a common process for forming integrated circuits. Therefore, the same etcher that is used to form via opening 22 of wafer 100 may also be used to form openings of other wafers, which, although also have via openings, will have a different design of the integrated circuits. In this case, when a wafer that is prone to the JTAG failure problem is undergoing a via-etching process, an $O_2$ neutralization step may be added to reduce the JTAG failure. In this case, the ashing of photo resist 38 may be performed using a recipe substantially, or even exactly the same as the ashing recipe of the photo resist on another wafer, wherein the ashing recipe may include the time, energy, process gas, and the like. On the other hand, the other wafer having a different design may not be prone to the JTAG failure, and hence no $O_2$ neutralization step is needed. Please note that the $O_2$ neutralization step may be added to the etching of one wafer, but not the other even if the via openings in these two wafers are on a same metal level, for example, both being in metal layer 2 (commonly known as M2).

The embodiments of the present invention have several advantageous features. By adding the $O_2$ neutralization step in the de-chuck process of the via-etching processes, the JTAG failure rate has significantly reduced. Experiments have revealed that if the conventional photo resist ashing process is used, the JTAG failure rate may be as high as about 12 percent to about 18 percent, with the average being about 5.6 percent. However, by adding the additional $O_2$ neutralization step, the JTAG failure rate on same type of wafers having the same design is reduced to lower than about 3 percent, with the average being about 1.1 percent.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:
1. A method of forming an integrated circuit structure on a wafer, the method comprising:

providing an etcher comprising an electrostatic chuck (ESC);
placing the wafer on the ESC, wherein the wafer comprises:
   a conductive feature; and
   a dielectric layer over the conductive feature;
forming and patterning a photo resist over the wafer;
etching the dielectric layer to form a via opening in the wafer using the etcher;
performing an ashing to the photo resist to remove the photo resist;
after the step of ashing, performing an oxygen neutralization to the wafer; and
after the oxygen neutralization, performing a de-chuck step to release the wafer from the ESC.

2. The method of claim 1, wherein the de-chuck step comprises an argon de-chuck step and a step of applying a reverse de-chuck voltage to the ESC.

3. The method of claim 1, wherein the step of oxygen neutralization comprises:
   introducing an oxygen-containing process gas into the etcher; and
   providing an energy to ionize the oxygen-containing process gas.

4. The method of claim 1, wherein during the step of oxygen neutralization, no helium is introduced into the etcher, and wherein during the step of ashing the photo resist and the step of performing the de-chuck step, helium is introduced into the etcher.

5. The method of claim 1, wherein a same oxygen-containing process gas is used in the step of oxygen neutralization and the step of performing the ashing.

6. The method of claim 1 further comprising, during the step of performing the de-chuck step and a period after the step of performing the de-chuck:
   detecting a helium flow; and
   using values of the helium flow to determine a charge release status of the wafer.

7. The method of claim 6, wherein:
   when the charge release status indicates an abnormal charge accumulation in the wafer, performing an additional de-chuck step before the wafer is lifted; and
   when the charge release status indicates a normal charge accumulation in the wafer, lifting the wafer without performing the additional de-chuck step.

8. The method of claim 6 further comprising, after the step of detecting the helium flow, lifting up the wafer from the ESC.

9. A method of forming an integrated circuit structure on a wafer, the method comprising:
   providing a first etcher comprising a first electrostatic chuck (ESC);
   forming and patterning a first photo resist on the wafer;
   placing the wafer on the first ESC;
   forming a via opening in the wafer using the first etcher;
   after the step of forming the via opening, ashing the first photo resist;
   performing an oxygen neutralization step to the wafer;
   performing a first de-chuck to the wafer;
   forming and patterning a second photo resist on the wafer;
   placing the wafer on a second ESC of a second etcher;
   performing an etching step to form an additional opening in the wafer using the second etcher; and
   performing a second de-chuck to the wafer, wherein no oxygen neutralization step is performed to the wafer in the second etcher.

10. The method of claim 9, wherein the step of ashing the first photo resist and the step of ashing the second photo resist are performed using substantially same process conditions.

11. The method of claim 9, wherein during the step of ashing the first photo resist, a helium flow into the first etcher is turned on, and wherein during the oxygen neutralization step, the helium flow is turned off.

12. The method of claim 9, wherein the first etcher and the second etcher are different etchers.

13. The method of claim 9, wherein the first etcher and the second etcher are a same etcher.

14. The method of claim 9, wherein the oxygen neutralization step is performed for a duration between about 3 seconds and about 15 seconds.

15. The method of claim 9 further comprising, during the step of performing the first de-chuck and a period after the step of performing the first de-chuck:
   detecting a helium flow; and
   using values of the helium flow to determine a charge release status of the wafer.

16. A method of forming an integrated circuit structure, the method comprising:
   providing an etcher comprising an electrostatic chuck (ESC);
   forming and patterning a first photo resist on a first wafer;
   placing the first wafer on the ESC;
   forming a first via opening in the first wafer using the etcher;
   after the step of forming the first via opening, ashing the first photo resist;
   performing an oxygen neutralization step to the first wafer;
   performing a first de-chuck to the first wafer;
   forming and patterning a second photo resist on a second wafer;
   placing the second wafer on the ESC;
   forming a second via opening in the second wafer using the etcher;
   after the step of forming the second via opening, ashing the second photo resist; and
   performing a second de-chuck to the second wafer, wherein no oxygen neutralization step is performed to the second wafer in the etcher.

17. The method of claim 16, wherein the step of ashing the first photo resist and the step of ashing the second photo resist are performed using substantially same process conditions.

18. The method of claim 17, wherein the step of ashing the first photo resist and the step of ashing the second photo resist are performed for substantially a same length of time.

19. The method of claim 16, wherein during the step of ashing the first photo resist, helium flow into the etcher is turned on, and wherein during the oxygen neutralization step, helium flow is turned off 20. The method of claim 16, wherein the oxygen neutralization step is performed for a duration between about 3 seconds and about 6 seconds.

21. The method of claim 16 further comprising, during the step of performing the first de-chuck and a period after the step of performing the first de-chuck:
   detecting a helium flow; and
   using values of the helium flow to determine a charge release status of the first wafer.

* * * * *